United States Patent [19]

Gliem et al.

[11] 4,364,792

[45] Dec. 21, 1982

[54] PROCESS FOR THE PRODUCTION OF ADHESIVE METAL LAYERS ON NON-CONDUCTORS ESPECIALLY SYNTHETIC RESINS

[75] Inventors: Ralf Gliem, Wetter; Reinhard Brandt, Marburg, both of Fed. Rep. of Germany

[73] Assignees: Degussa AG, Frankfurt am Main; Schoeller & Co., Elektronik GmbH, Wetter, both of Fed. Rep. of Germany

[21] Appl. No.: 141,301

[22] Filed: Apr. 18, 1980

[30] Foreign Application Priority Data

Apr. 20, 1979 [DE] Fed. Rep. of Germany ....... 2916006

[51] Int. Cl.[3] .......................... B44C 1/22; B05D 3/06
[52] U.S. Cl. ..................... 156/628; 156/643; 204/192 R; 204/192 C; 427/36; 427/99; 427/250; 427/307; 427/309
[58] Field of Search ............ 427/35, 36, 38, 96, 427/383.5, 383.1, 99, 250; 204/192 D, 192 E, 192 C, 192 R, 192 EC; 156/643, 628

[56] References Cited

U.S. PATENT DOCUMENTS

| | | | |
|---|---|---|---|
| 3,262,808 | 7/1966 | Crooks et al. | 427/40 X |
| 3,547,683 | 12/1970 | Williams et al. | 427/36 |
| 3,914,472 | 10/1975 | Nakanishi et al. | 427/38 X |
| 3,930,066 | 12/1975 | Ryan et al. | 427/35 X |

FOREIGN PATENT DOCUMENTS 46-24554 7/1971 Japan .................................. 427/35

Primary Examiner—Thurman K. Page
Attorney, Agent, or Firm—Cushman, Darby & Cushman

[57] ABSTRACT

Known process for the metallization of non-conductors, particularly synthetic resins, by chemical deposition, evaporation, or sputtering operate with adhesion facilitating intermediate layers such as e.g. varnishes or pastes. There is not attained sufficient adhesiveness with these adhesion facilitators for many areas of use. Besides the adhesive facilitator can cause troubles in later processing. Therefore there is described a process in which the surface area to be coated is roughened by means of a preliminary etching before by the metallizing and wherein this surface area before the etching is exposed to a heavy ion radiation.

8 Claims, No Drawings

PROCESS FOR THE PRODUCTION OF ADHESIVE METAL LAYERS ON NON-CONDUCTORS ESPECIALLY SYNTHETIC RESINS

BACKGROUND OF THE INVENTION

The invention is directed to a process for the production of adhesive metal coatings applied chemically, by evaporation in vacuum or by sputtering to electrical non-conductors, especially synthetic resins, by roughening the surface regions to be coated by means of a preliminary etching before the metallization.

Metallized non-conductors, especially metallized synthetic resins, find many uses in all areas of technology. The metal coatings are produced by evaporation, chemical deposition or by pasting or rolling onto films.

Insofar as the metallization is not only for decorative purposes, the adhesiveness of the metal coating is always of greater importance.

There are known various processes for increasing the adhesiveness of the metal coatings before the metallization. This occurs above all through roughening of the surface to be coated by means of buffing processes, impressing a relief in the surface, swelling and roughening the surface by means of acids, alkalis or solvents, use of adhesion facilitating intermediate layers (varnishes, pastes), by means of acids or alkalis embedding foreign materials in the adhesive facilitator which foreign materials can be dissolved out (cavity formation), or through evaporation of the adhesion facilitating intermediate layers.

For the cases of use in which the metal coating must have a defined adhesiveness in the range of greater than 1.2 n/mm, previously sufficient values were produced only through the use of paste systems or adhesion facilitators.

However, even with these adhesion facilitators and adhesive systems, the adhesives frequently prove insufficient in the later processing of the materials, particularly in thermal requirements. This concerns specifically all materials with paste systems. For example the paste causes problems in later soldering processes or bonding processes if such materials are used for the production of printed circuits. Furthermore, pastes and adhesive facilitators are expensive and can only be applied uniformly at high expense.

Therefore it was the problem of the present invention to develop a process for the production of adhesive metallic coatings applied chemically, by evaporation in a vacuum or by sputtering on non-conductors, especially on synthetic resins, by roughening the surface region to be coated by means of a preliminary etching before the metallization through which a very high adhesiveness of the metal coating is attained, even without the use of adhesive facilitating intermediate layers.

SUMMARY OF THE INVENTION

This problem was solved according to the invention by exposing the region of the surface to be coated before the etching process to a heavy ion irradiation, above all a heavy ion radiation which is produced through radiation of uranium with neutrons. Also alternatively there can be used fission products which arise in the spontaneous fission, especially of Californium-252.

As the supports to be coated which are exposed to radiation there are preferably exposed synthetic resins such as polyimides (e.g. from pyromellitic anhydride condensed with oxydianiline or methylene dianiline), polyesters (e.g. polyethylene terephthalate or the condensation product of tris(2-hydroxyethyl) isocyanurate, ethylene glycol and terephthalic acid or the condensation product of glycerine, ethylene glycol and terephthalic acid), polycarbonates (e.g. bisphenol A polycarbonate) and/or epoxide resins (e.g. bisphenol A-epichlorohydrin resin). There can also be used mica as the support to be coated.

Through this there is produced in the molecules near the surface changes which in a subsequent etching process lead to the formation of exactly defined depressions (cavities) in the surface according to the side, shape and number. By means of this defined surface roughening the adhesiveness of the layers to be metallized is substantially improved. The number, the size and the shape of the depression can be regulated through the choice of the heavy ion radiation, the duration, the intensity and the angle of incidence of the radiation and by the subsequent etching process.

Moreover, a slanting radiation direction (from a different direction) is particularly advantageous. In this way there are produced a slanting depression reaching into the surface which increase the adhesion of the metal layer by means of the so-called "zipper effect".

In addition to synthetic resin there can also be pretreated in this manner and subsequently metallized other non-conductors such as glass, ceramics or enamel.

Preferably the process of the invention is used for the copper plating of polyimide films, polycarbonates, polyester films and epoxide resin films and sheets. In this way for example there can be produced high quality printed circuits (flexible and rigid) with previously unattainable favorable cost properties.

As energy rich radiation there is advantageously used a heavy ion radiation with particles having a mass of greater than 10 and whose energy is greater than 0.1 meV per nucleon. The duration of irradiation thereby can vary between seconds and hours depending on the type of the radiation and the desired "aperture number". The number of heavy ions per unit of surface is decisive in this case.

The etching takes place with known etching solutions, for example with aqueous 1 N sodium hydroxide whereby the time of etching depends on the size of the desired "holes".

The evaporation or sputtering on of the metal coatings, particularly copper coating is carried out in commercial plants in a known manner.

There can be used other conventional etching solutions, e.g. alkali metal hydroxide solutions, such as sodium hydroxide solutions of other concentrations, potassium hydroxide solutions, etc.

There can be employed in place of copper in the metallization other conventional metals such as silver, aluminum, platinum, palladium, etc.

The entire disclosure of German priority application P 2916006.3 is hereby incorporated by reference.

The process can comprise, consist essentially of or consist of the steps set forth.

What is claimed is:

1. In a process for the production of an adhesive metal coating on a non-conductor chemically, by evaporation in a vacuum or by sputtering through roughening, the region of the surface to be coated by means of an etching process before the metallization, the improvement comprising exposing the region of the surface to be coated before the etching process to heavy ion radiation, the heavy ions having a mass of at least 10 and an energy of greater than 0.1 meV per nucleon.

2. The process of claim 1 wherein the non-conductor is a synthetic resin.

3. The process of claim 1 wherein the heavy ion radiation is produced by radiation of uranium with neutrons.

4. The process of claim 3 wherein there is irradiated a film or sheet of a polyimide, polyester, polycarbonate, epoxide resin or mica.

5. The process of claim 4 wherein after the etching the film or sheet is provided with an adherent copper coating.

6. The process of claim 5 wherein the etching is carried out with alkali metal hydroxide.

7. The process of claim 6 wherein the alkali metal hydroxide is sodium hydroxide.

8. The process of claim 4 wherein the etching is with sodium hydroxide solution.

* * * * *